US012588522B2

(12) United States Patent
Tsai et al.

(10) Patent No.: US 12,588,522 B2
(45) Date of Patent: Mar. 24, 2026

(54) SEMICONDUCTOR PACKAGE STRUCTURE

(71) Applicant: MEDIATEK INC., Hsinchu City (TW)

(72) Inventors: Yi-Lin Tsai, Hsinchu City (TW);
Kun-Ting Hung, Hsinchu City (TW);
Yin-Fa Chen, Hsinchu City (TW);
Chi-Yuan Chen, Hsinchu City (TW);
Wen-Sung Hsu, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 376 days.

(21) Appl. No.: 18/331,394

(22) Filed: Jun. 8, 2023

(65) Prior Publication Data

US 2024/0014143 A1      Jan. 11, 2024

Related U.S. Application Data

(60) Provisional application No. 63/368,089, filed on Jul. 11, 2022.

(51) Int. Cl.
H01L 23/538          (2006.01)
H01L 23/00           (2006.01)
(Continued)

(52) U.S. Cl.
CPC ...... H01L 23/5389 (2013.01); H01L 23/3128 (2013.01); H01L 23/49811 (2013.01);
(Continued)

(58) Field of Classification Search
CPC ....... H01L 21/6835; H01L 2224/16225; H01L 2224/32145; H01L 2224/73253;
(Continued)

(56) References Cited

U.S. PATENT DOCUMENTS 9,583,472 B2 *  2/2017  Chung .................... H01L 24/32
9,601,463 B2 *  3/2017  Yu ........................ H01L 25/0657
(Continued)

FOREIGN PATENT DOCUMENTS

KR      20200007509 A  *  1/2020  ............. H01L 24/85
KR      102413441 B1  *  6/2022  ......... H01L 25/0657

OTHER PUBLICATIONS

German language office action dated Jun. 4, 2025, issued in application No. DE 10 2023 117 334.0 (English language translation, pp. 1-6 of attachment).

*Primary Examiner* — Edward Chin
(74) *Attorney, Agent, or Firm* — McClure, Qualey & Rodack, LLP

(57)          ABSTRACT

A semiconductor package structure includes a first redistribution layer, a second redistribution layer, a first semiconductor die, a second semiconductor die, an adhesive layer, and a molding material. The second redistribution layer is disposed over the first redistribution layer. The first semiconductor die and the second semiconductor die are stacked vertically between the first redistribution layer and the second redistribution layer. The first semiconductor die is electrically coupled to the first redistribution layer, and the second semiconductor die is electrically coupled to the second redistribution layer. The adhesive layer extends between the first semiconductor die and the second semiconductor die. The molding material surrounds the first semiconductor die, the adhesive layer, and the second semiconductor die.

19 Claims, 13 Drawing Sheets

(51) Int. Cl.
H01L 23/31 (2006.01)
H01L 23/498 (2006.01)
H01L 25/065 (2023.01)
H01L 25/10 (2006.01)

(52) U.S. Cl.
CPC .............. H01L 24/16 (2013.01); H01L 24/32
(2013.01); H01L 24/73 (2013.01); H01L
25/0657 (2013.01); H01L 25/105 (2013.01);
*H01L 2224/16225* (2013.01); *H01L*
*2224/32145* (2013.01); *H01L 2224/73253*
(2013.01); *H01L 2225/06568* (2013.01); *H01L*
*2225/1058* (2013.01)

(58) Field of Classification Search
CPC ......... H01L 2224/8385; H01L 2225/04; H01L
2225/06548; H01L 2225/06558; H01L
2225/06568; H01L 2225/1017; H01L
2225/1041; H01L 2225/1058; H01L
23/3128; H01L 23/49811; H01L
23/49816; H01L 23/50; H01L 23/5389;

H01L 24/08; H01L 24/16; H01L 24/24;
H01L 24/32; H01L 24/73; H01L 24/92;
H01L 25/0657; H01L 25/105; H01L
25/50

See application file for complete search history.

(56) References Cited

U.S. PATENT DOCUMENTS

| | | | | |
|---|---|---|---|---|
| 2015/0303174 A1* | 10/2015 | Yu | ........................ | H01L 23/3128 |
| | | | | 438/109 |
| 2016/0260695 A1* | 9/2016 | Chung | .................... | H01L 23/34 |
| 2017/0084589 A1 | 3/2017 | Kuo | | |
| 2017/0194290 A1* | 7/2017 | Yu | ........................ | H01L 25/0652 |
| 2019/0006316 A1* | 1/2019 | Yu | ........................ | H01L 23/3128 |
| 2019/0333893 A1* | 10/2019 | Yu | ........................ | H01L 23/3128 |
| 2019/0371781 A1 | 12/2019 | Huang | | |
| 2021/0320085 A1* | 10/2021 | Yang | ................... | H01L 23/5385 |
| 2022/0173220 A1* | 6/2022 | Sun | .................... | H10D 30/6735 |

* cited by examiner

SEMICONDUCTOR PACKAGE STRUCTURE

CROSS REFERENCE TO RELATED APPLICATIONS

This application claims the benefit of U.S. Provisional Application No. 63/368,089 filed on Jul. 11, 2022, the entirety of which is incorporated by reference herein.

BACKGROUND OF THE INVENTION

Field of the Invention

The present invention is related to semiconductor technology, and in particular to a semiconductor package structure that includes stacked semiconductor dies.

Description of the Related Art

A semiconductor package structure can not only provide a semiconductor die with protection from environmental contaminants, but it can also provide an electrical connection between the semiconductor die packaged therein and a substrate, such as a printed circuit board (PCB).

Although existing semiconductor package structures generally meet the requirements placed on them, they have not been satisfactory in all respects. For example, as semiconductor dies come to include more and more functions, the cost and difficulty of manufacturing the semiconductor package structures increases. Therefore, further improvements in semiconductor package structures are required.

BRIEF SUMMARY OF THE INVENTION

Semiconductor package structures are provided. An exemplary embodiment of a semiconductor package structure includes a first redistribution layer, a second redistribution layer, a first semiconductor die, a second semiconductor die, an adhesive layer, and a molding material. The second redistribution layer is disposed over the first redistribution layer. The first semiconductor die and the second semiconductor die are stacked vertically between the first redistribution layer and the second redistribution layer. The first semiconductor die is electrically coupled to the first redistribution layer, and the second semiconductor die is electrically coupled to the second redistribution layer. The adhesive layer extends between the first semiconductor die and the second semiconductor die. The molding material surrounds the first semiconductor die, the adhesive layer, and the second semiconductor die.

Another exemplary embodiment of a semiconductor package structure includes a first package structure and a second package structure disposed over the first package structure. The first package structure includes a first redistribution layer, a first semiconductor die, a second semiconductor die, an adhesive layer, and a second redistribution layer. The first semiconductor die is disposed over the first redistribution layer and is electrically coupled to the first redistribution layer through a plurality of first conductive connectors. The second semiconductor die is disposed over the first semiconductor die. The adhesive layer connects the first semiconductor die and the second semiconductor die. The second redistribution layer is disposed over the second semiconductor die and is electrically coupled to the second semiconductor die through a plurality of second conductive connectors.

Yet another exemplary embodiment of a semiconductor package structure includes a first redistribution layer, a second redistribution layer, a first semiconductor die, a second semiconductor die, a third semiconductor die, an adhesive layer, and a molding material. The second redistribution layer is disposed over the first redistribution layer. The first semiconductor die is disposed between the first redistribution layer and the second redistribution layer and is electrically coupled to the first redistribution layer. The second semiconductor die and the third semiconductor die are disposed side-by-side over the first semiconductor die and are electrically coupled to the second redistribution layer. The adhesive layer connects the first semiconductor die and the second semiconductor die and connects the first semiconductor die and the third semiconductor die. The molding material surrounds the first semiconductor die, the adhesive layer, the second semiconductor die, and the third semiconductor die.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figures 1A, 1B:
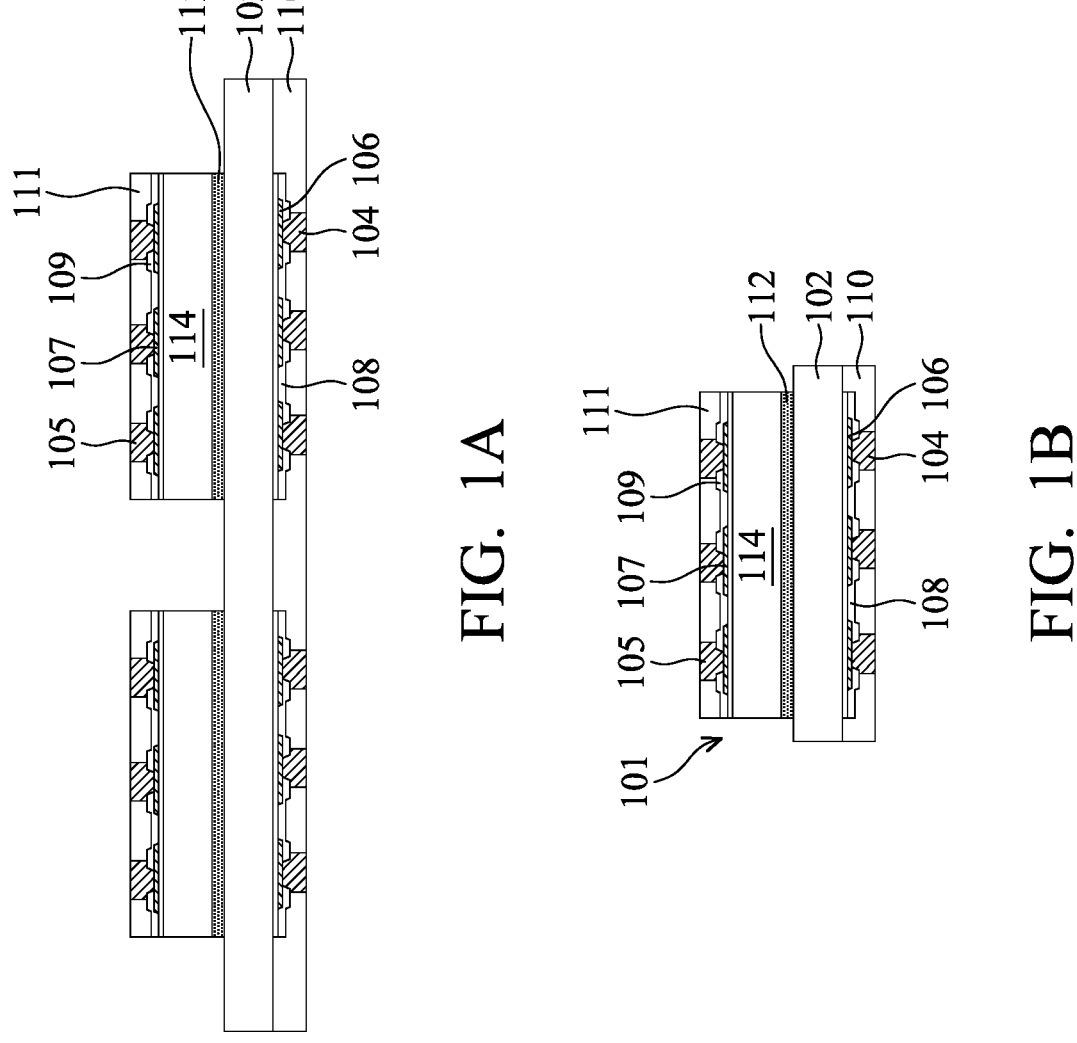
FIGS. 1A to 1H are cross-sectional views of an exemplary method of forming a semiconductor package structure in accordance with some embodiments.

The following description is made for the purpose of illustrating the general principles of the invention and should not be taken in a limiting sense. The scope of the invention is best determined by reference to the appended claims.

The present disclosure will be described with respect to particular embodiments and with reference to certain drawings, but the disclosure is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the disclosure.

Additional elements may be added on the basis of the embodiments described below. For example, the description of "a first element on/over a second element" may include embodiments in which the first element is in direct contact with the second element, and may also include embodiments in which additional elements are disposed between the first element and the second element such that the first element and the second element are not in direct contact.

Furthermore, the description of "a first element extending through a second element" may include embodiments in which the first element is disposed in the second element and extends from a side of the second element to an opposite side of the second element, wherein a surface of the first element may be substantially leveled with a surface of the second element, or a surface of the first element may be outside a surface of the second element.

The spatially relative descriptors of the first element and the second element may change as the structure is operated or used in different orientations. In addition, the present disclosure may repeat reference numerals and/or letters in the various embodiments. This repetition is for simplicity and clarity and does not in itself dictate a relationship between the various embodiments discussed.

A semiconductor package structure including stacked semiconductor dies is described in accordance with some embodiments of the present disclosure. The semiconductor dies are stacked back-to-back through an adhesive layer, so that cost saving and flexible chip design can be achieved.

FIGS. 1A to 1H are cross-sectional views of an exemplary method of forming a semiconductor package structure 100 in accordance with some embodiments of the disclosure. Additional features can be added to the semiconductor package structure 100. Some of the features described below can be replaced or eliminated for different embodiments. To simplify the diagram, only a portion of the semiconductor package structure 100 is illustrated.

As shown in FIG. 1A, a semiconductor wafer 102 is provided, in accordance with some embodiments. The semiconductor wafer 102 may be formed of any suitable semiconductor material, such as silicon, germanium, silicon carbon, silicon germanium, gallium arsenide, indium arsenide, indium phosphide, the like, or a combination thereof. The semiconductor wafer 102 may include a bulk semiconductor or a composite substrate formed of different materials. Any desired semiconductor elements (including active elements and/or passive elements) may be formed in and on the semiconductor wafer 102. However, in order to simplify the figures, only the flat semiconductor wafer 102 is illustrated.

The semiconductor wafer 102 may include a plurality of first semiconductor dies. In some embodiments, the first semiconductor dies each includes a system-on-chip (SoC) die, a logic device, a memory device, a radio frequency (RF) device, the like, or any combination thereof. For example, the first semiconductor dies may each include a micro control unit (MCU) die, a microprocessor unit (MPU) die, a power management integrated circuit (PMIC) die, a radio frequency front end (RFFE) die, an accelerated processing unit (APU) die, a central processing unit (CPU) die, a graphics processing unit (GPU) die, an input-output (IO) die, a dynamic random access memory (DRAM) controller, a static random-access memory (SRAM), a high bandwidth memory (HBM), an application processor (AP) die, the like, or any combination thereof.

As illustrated in FIG. 1A, a plurality of first conductive pads 106 are formed on the semiconductor wafer 102, in accordance with some embodiments. The conductive pads 106 may be formed of conductive materials, including metal (e.g., tungsten, titanium, tantalum, ruthenium, cobalt, copper, aluminum, platinum, tin, silver, gold), metallic compound (e.g., tantalum nitride, titanium nitride, tungsten nitride), the like, an alloy thereof, or a combination thereof.

A first passivation layer 108 is formed on the first conductive pads 106, in accordance with some embodiments. As shown in FIG. 1A, the first passivation layer 108 may cover edge portions of the first conductive pads 106. In some embodiments, the first passivation layer 108 may include a polymer layer, which may be formed of polyimide (PI), polybenzoxazole (PBO), benzocyclobutene (BCB), epoxy, the like, or a combination thereof. Alternatively, the first passivation layer 108 may include a dielectric layer, which may be formed of silicon oxide, silicon nitride, silicon oxynitride, the like, or a combination thereof.

According to some embodiments, a plurality of first conductive connectors 104 are formed on and electrically coupled to the first conductive pads 106, respectively. The first conductive connectors 104 may include conductive pillars. The first conductive connectors 104 may be formed of conductive materials, including metal (e.g., tungsten, titanium, tantalum, ruthenium, cobalt, copper, aluminum, platinum, tin, silver, gold), metallic compound (e.g., tantalum nitride, titanium nitride, tungsten nitride), the like, an alloy thereof, or a combination thereof.

A first dielectric layer 110 is formed on the first passivation layer 108 and surrounds the first conductive connectors 104, in accordance with some embodiments. The first dielectric layer 110 may be formed of dielectric materials, including silicon oxide, silicon nitride, silicon oxynitride, the like, or a combination thereof.

As shown in FIG. 1A, a plurality of second semiconductor dies 114 are formed over the first semiconductor dies of the semiconductor wafer 102, respectively, with an adhesive layer 112 disposed therebetween, in accordance with some embodiments. In particular, the second semiconductor dies 114 and the first semiconductor dies of the semiconductor wafer 102 are stacked back-to-back. In this way, bump structures, such as microbump structures or hybrid bump structures, are not used to bond the semiconductor dies. As a result, the semiconductor dies can be stacked more flexibly than conventional stacking (stacked face-to-face). In addition, the manufacturing cost can be saved, and the Outsourced Semiconductor Assembly and Test Services (OSATs) manufacturing can be friendlier.

The adhesive layer 112 may extend between the semiconductor wafer 102 and one of the second semiconductor dies 114. The sidewall of the adhesive layer 112 may be substantially coplanar with the sidewall of the second semiconductor die 114. The adhesive layer 112 may include an attach film. In some embodiments, the adhesive layer 112 includes conductive paste (CP), non-conductive paste (NCP), high-k film, epoxy, any applicable materials, or a combination thereof.

In some embodiments, the second semiconductor dies 114 include a system-on-chip (SoC) die, a logic device, a memory device, a radio frequency (RF) device, the like, or any combination thereof. For example, the second semiconductor dies 114 may include a micro control unit (MCU) die, a microprocessor unit (MPU) die, a power management integrated circuit (PMIC) die, a radio frequency front end (RFFE) die, an accelerated processing unit (APU) die, a central processing unit (CPU) die, a graphics processing unit (GPU) die, an input-output (IO) die, a dynamic random access memory (DRAM) controller, a static random-access memory (SRAM), a high bandwidth memory (HBM), an application processor (AP) die, the like, or any combination thereof. The second semiconductor dies 114 and the first semiconductor dies of the semiconductor wafer 102 may include the same or different devices.

As illustrated in FIG. 1A, a plurality of second conductive pads 107, a second passivation layer 109, a plurality of second conductive connectors 105, and a second dielectric layer 111 are formed on the second semiconductor dies 114, in accordance with some embodiments. The second conductive pads 107, the second passivation layer 109, the second conductive connectors 105, and the second dielectric layer 111 may be similar to the first conductive pads 106, the first passivation layer 108, the first conductive connectors 104, and the first dielectric layer 110, respectively, and will not be repeated.

As illustrated in FIG. 1B, the semiconductor wafer 102 is sawed to form the first semiconductor dies 102, in accordance with some embodiments. After sawing, the sidewall of the first dielectric layer 110 may be substantially coplanar with the sidewall of first semiconductor dies 102. A stacking structure 101, including the first semiconductor die 102, the second semiconductor die 114, and the components formed thereon, may be formed.

Figures 1C, 1D:
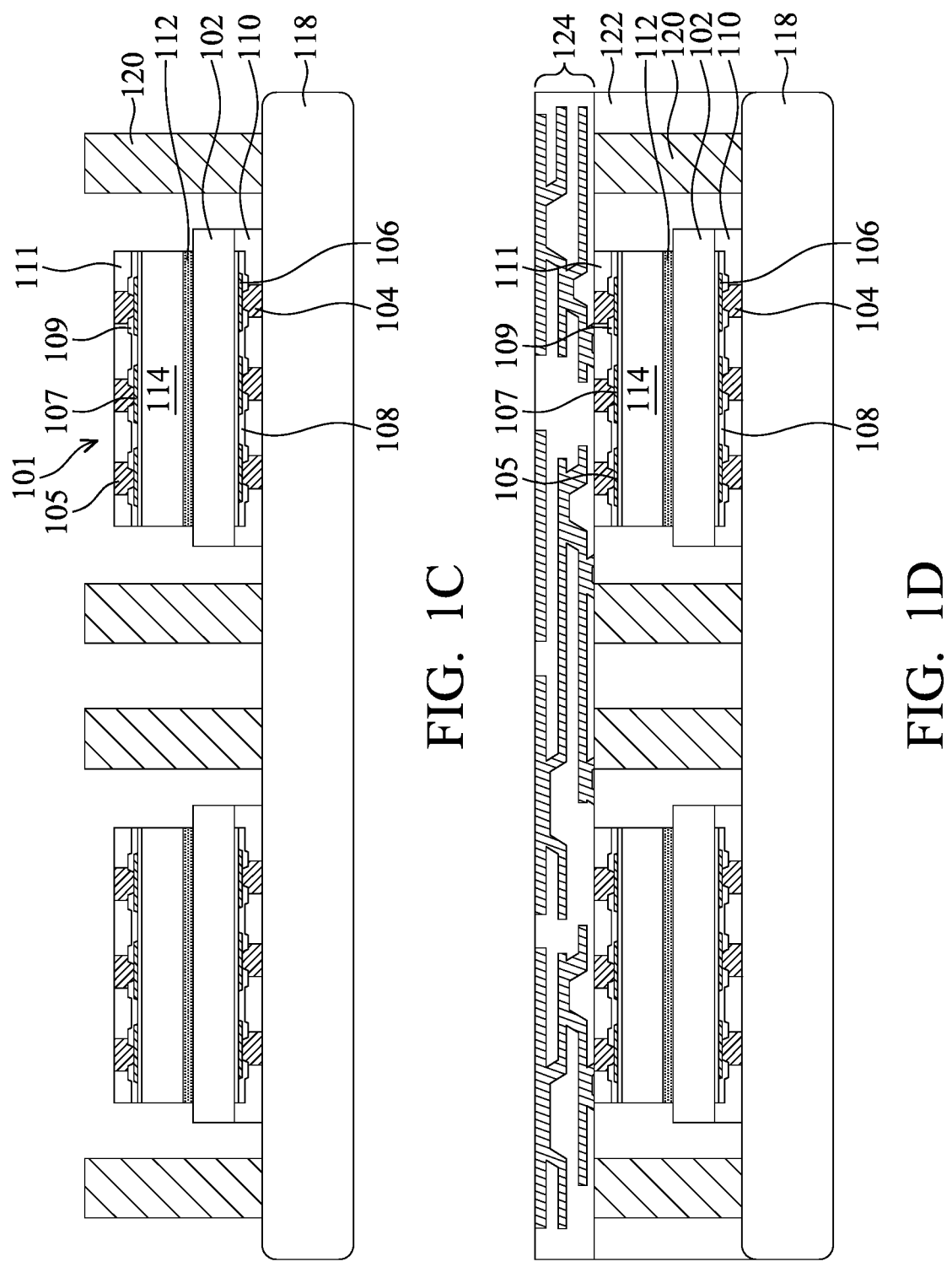

As illustrated in FIG. 1C, the stacking structure 101 and a plurality of conductive pillars 120 are disposed over a carrier substrate 118, in accordance with some embodiments. The carrier substrate 118 should be sufficiently rigid to serve as a temporary support during further processing. In some embodiments, the carrier substrate 118 includes a silicon wafer, a metallic plate, the like, or any suitable materials. The conductive pillars 120 may be formed of conductive materials, including metal (e.g., tungsten, titanium, tantalum, ruthenium, cobalt, copper, aluminum, platinum, tin, silver, gold), metallic compound (e.g., tantalum nitride, titanium nitride, tungsten nitride), the like, an alloy thereof, or a combination thereof.

It should be noted that additional semiconductor dies may also be disposed over the carrier substrate 118. Moreover, one or more passive components (not illustrated), including resistors, capacitors, inductors, the like, or a combination thereof, may be disposed over the carrier substrate 118.

As shown in FIG. 1D, a molding material 122 is formed over the carrier substrate 118, in accordance with some embodiments. The molding material 122 may surround the first semiconductor dies 102, the first dielectric layer 110, the adhesive layer 112, the second semiconductor dies 114, the second dielectric layer 111, and the conductive pillars 120. The molding material 122 may protect these components from the environment, thereby preventing them from damage due to stress, chemicals, and moisture. The molding material 122 may be formed of a nonconductive material, including moldable polymer, epoxy, resin, the like, or a combination thereof.

Afterwards, a planarization process is preformed to level the top surface of the molding material 122, the top surfaces of the second conductive connectors 105, and the top surfaces of the conductive pillars 120, in accordance with some embodiments. The planarization process may include a chemical mechanical polishing (CMP) process, a mechanical grinding process, the like, or a combination thereof. According to some embodiments, single molding and planarizing are used, resulting in lower cost and higher yield.

Afterwards, a redistribution layer 124 is formed over the molding material 122, in accordance with some embodiments. The redistribution layer 124 may be electrically coupled to the second semiconductor die 114 through the second conductive connectors 105 and the second conductive pads 107.

The redistribution layer 124 may include conductive layers disposed in passivation layers. The conductive layers may be formed of conductive materials, including metal (e.g., tungsten, titanium, tantalum, ruthenium, cobalt, copper, aluminum, platinum, tin, silver, gold), metallic compound (e.g., tantalum nitride, titanium nitride, tungsten nitride), the like, an alloy thereof, or a combination thereof. The passivation layers may include polymer layers, which may be formed of polyimide (PI), polybenzoxazole (PBO), benzocyclobutene (BCB), epoxy, the like, or a combination thereof. Alternatively, the passivation layers may include dielectric layers, which may be formed of silicon oxide, silicon nitride, silicon oxynitride, the like, or a combination thereof.

Figure 1E:
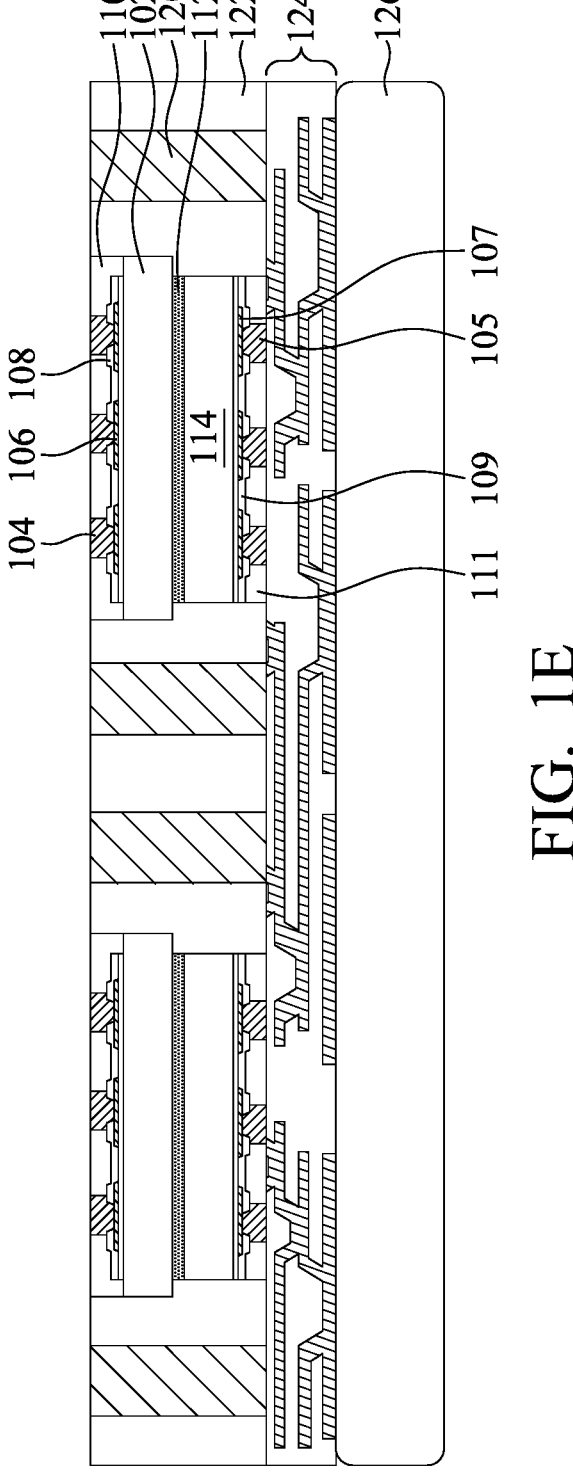

Afterwards, as shown in FIG. 1E, the structure illustrated in FIG. 1D is flipped upside down and disposed over another carrier substrate 126, in accordance with some embodiments. The top surface of the first conductive connectors 104 may be exposed. The carrier substrate 126 may be similar to the carrier substrate 118 as shown in FIG. 1C, and will not be repeated.

Figure 1F:
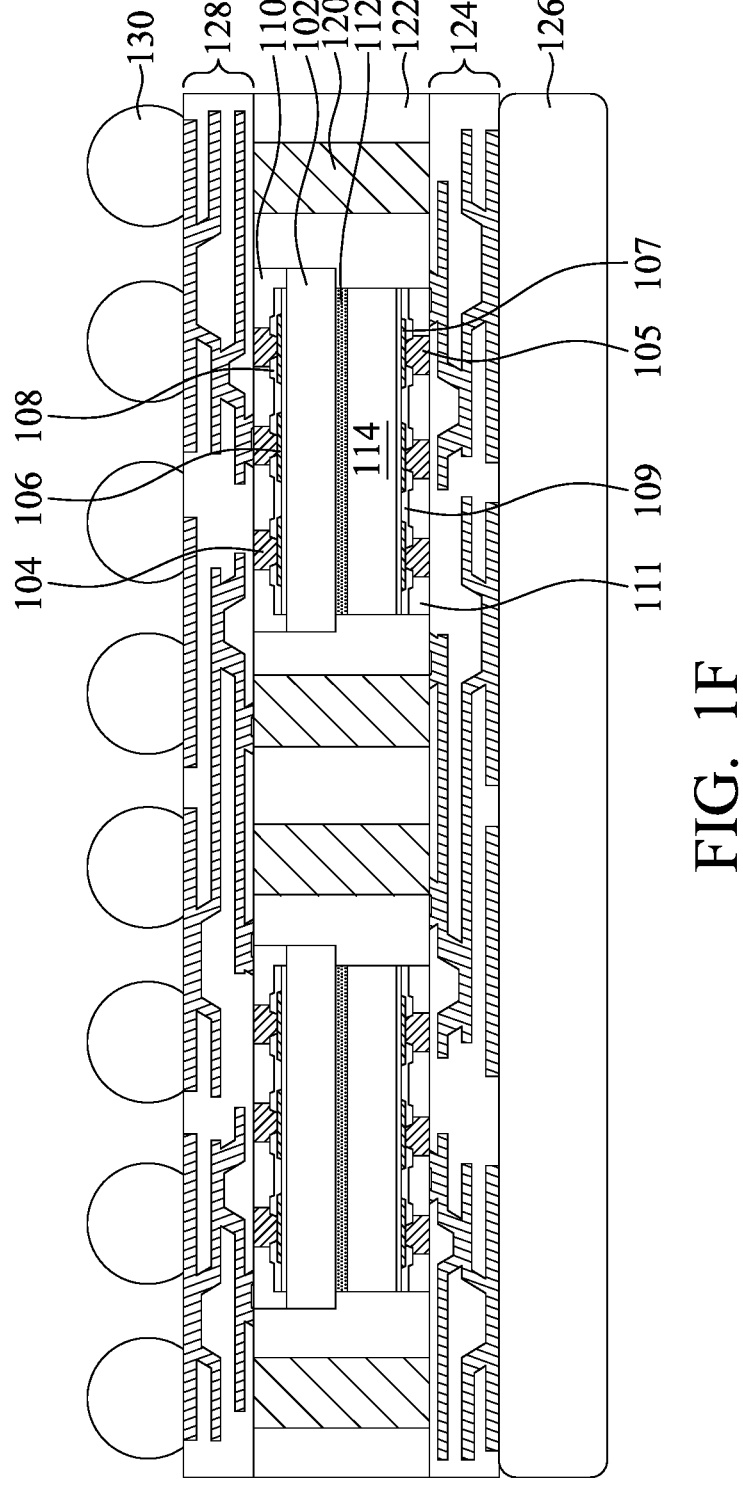

Afterwards, as shown in FIG. 1F, another redistribution layer 128 is formed over the molding material 122, in accordance with some embodiments. The redistribution layer 128 may be electrically coupled to the first semiconductor die 102 through the first conductive connectors 104 and the first conductive pads 106, and may be electrically coupled to the redistribution layer 124 through the conductive pillars 120. The redistribution layer 128 may be similar to the redistribution layer 124, and will not be repeated. However, the numbers of the conductive layers and the passivation layers of the redistribution layer 128 may be different than the numbers of the conductive layers and the passivation layers of the redistribution layer 124.

Afterwards, a plurality of first conductive terminals 130 are formed over the redistribution layer 128, in accordance with some embodiments. The first conductive terminals 130 may include microbumps, controlled collapse chip connection (C4) bumps, solder balls, ball grid array (BGA) balls, the like, or a combination thereof. The first conductive terminals 130 may be formed of conductive materials, including metal (e.g., tungsten, titanium, tantalum, ruthenium, cobalt, copper, aluminum, platinum, tin, silver, gold), metallic compound (e.g., tantalum nitride, titanium nitride, tungsten nitride), the like, an alloy thereof, or a combination thereof.

Figure 1G:
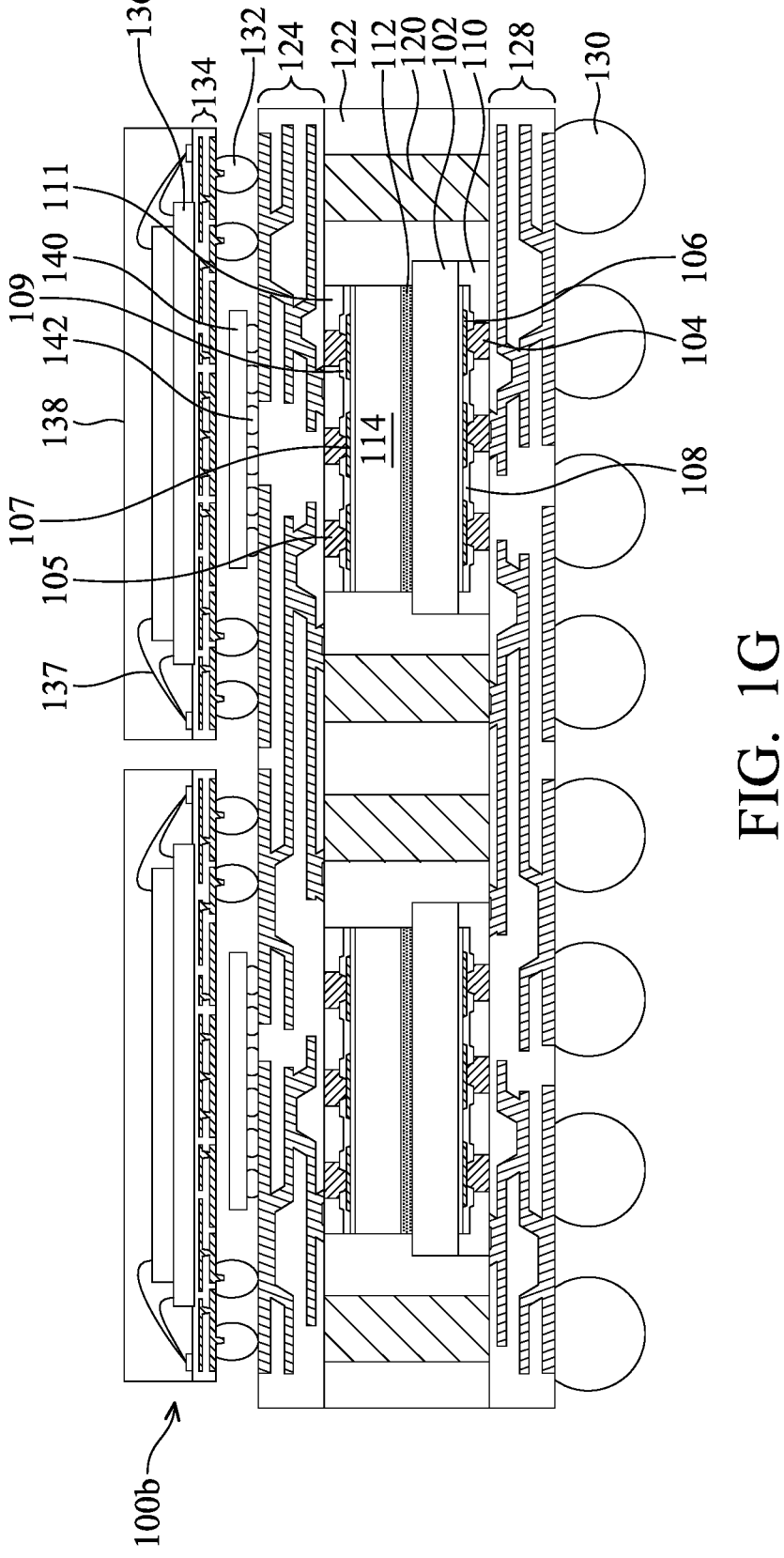

Afterwards, as shown in FIG. 1G, the structure illustrated in FIG. 1F is flipped upside down and the carrier substrate 126 is removed, in accordance with some embodiments. Then, a third semiconductor die 140 may be formed over the second redistribution layer 124. The third semiconductor die 140 is optional, and may be omitted in some other embodiments.

In some embodiments, the third semiconductor die 140 includes a system-on-chip (SoC) die, a logic device, a memory device, a radio frequency (RF) device, the like, or any combination thereof. For example, the third semiconductor die 140 may include a micro control unit (MCU) die, a microprocessor unit (MPU) die, a power management integrated circuit (PMIC) die, a radio frequency front end (RFFE) die, an accelerated processing unit (APU) die, a central processing unit (CPU) die, a graphics processing unit (GPU) die, an input-output (TO) die, a dynamic random access memory (DRAM) controller, a static random-access memory (SRAM), a high bandwidth memory (HBM), an application processor (AP) die, the like, or any combination thereof. The third semiconductor die 140, the second semiconductor die 114, and the first semiconductor die 102 may include the same or different devices.

The third semiconductor die 140 is electrically coupled to the redistribution layer 124 through a plurality of bump structures 142, in accordance with some embodiments. The bump structures 142 may include microbumps, controlled collapse chip connection (C4) bumps, solder balls, ball grid array (BGA) balls, the like, or a combination thereof. The bump structures 142 may be formed of conductive materials, including metal (e.g., tungsten, titanium, tantalum, ruthenium, cobalt, copper, aluminum, platinum, tin, silver, gold), metallic compound (e.g., tantalum nitride, titanium nitride, tungsten nitride), the like, an alloy thereof, or a combination thereof.

Afterwards, a package structure 100*b* is formed over the second redistribution layer 124, in accordance with some embodiments. For example, the package structure 100*b* may include an embedded multi-chip package (eMCP) structure or any suitable package structure.

The package structure 100*b* includes a package substrate 134, in accordance with some embodiments. The package substrate 134 may have a wiring structure therein. In some embodiments, the wiring structure of the package substrate 134 includes conductive layers, conductive vias, conductive pillars, the like, or a combination thereof. The wiring structure of the package substrate 134 may be formed of conductive materials, including metal (e.g., tungsten, titanium, tantalum, ruthenium, cobalt, copper, aluminum, platinum, tin, silver, gold), metallic compound (e.g., tantalum nitride, titanium nitride, tungsten nitride), the like, an alloy thereof, or a combination thereof.

The wiring structure of the package substrate 134 may be disposed in inter-metal dielectric (IMD) layers. In some embodiments, the IMD layers may be formed of organic materials, such as a polymer base material, a non-organic material, such as silicon nitride, silicon oxide, silicon oxynitride, the like, or a combination thereof. Any desired semiconductor element may be formed in and on the package substrate 134.

The package structure 100*b* includes a plurality of second conductive terminals 132 disposed below the package substrate 134 and electrically coupled to the second redistribution layer 124, in accordance with some embodiments. As shown in FIG. 1G, the third semiconductor die 140 may be disposed between the second conductive terminals 132. The second conductive terminals 132 may include microbumps, controlled collapse chip connection (C4) bumps, solder balls, ball grid array (BGA) balls, the like, or a combination thereof. The second conductive terminals 132 may be formed of conductive materials, including metal (e.g., tungsten, titanium, tantalum, ruthenium, cobalt, copper, aluminum, platinum, tin, silver, gold), metallic compound (e.g., tantalum nitride, titanium nitride, tungsten nitride), the like, an alloy thereof, or a combination thereof.

As shown in FIG. 1G, the package structure 100*b* includes one or more semiconductor dies 136 disposed over the package substrate 134, in accordance with some embodiments. The number of the semiconductor dies 136 shown in the figures are exemplary only and are not intended to limit the present disclosure. The semiconductor dies 136 may include the same or different devices. For example, the semiconductor dies 136 may include memory dies, such as a dynamic random access memory (DRAM), or any suitable devices. The semiconductor dies 136 may be electrically coupled to the package substrate 134 through a plurality of bonding wires 137. The package structure 100*b* may also include one or more passive components (not illustrated), including resistors, capacitors, inductors, the like, or a combination thereof.

The package structure 100*b* includes a molding material 138 disposed over the package substrate 134, in accordance with some embodiments. The molding material 138 may surround the semiconductor dies 136 and the bonding wires 137. The molding material 138 may protect the semiconductor dies 136 and the bonding wires 137 from the environment, thereby preventing these components from damage due to stress, chemicals, and moisture. The molding material 138 may be formed of a nonconductive material, including moldable polymer, epoxy, resin, the like, or a combination thereof.

Figure 1H:
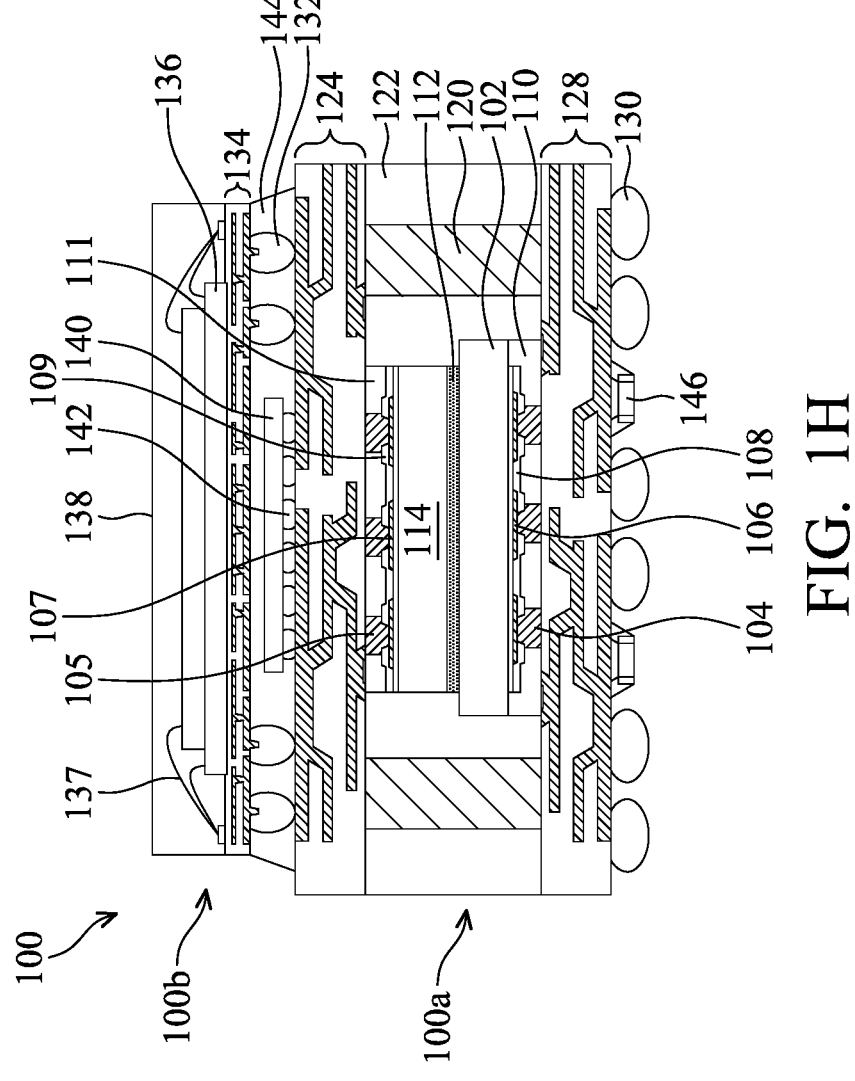

Afterwards, as shown in FIG. 1H, an underfill material 144 is formed over the redistribution layer 124, in accordance with some embodiments. The underfill material 144 may fill in gaps between the second conductive terminals 132, the third semiconductor die 140, and the bump structures 142 to provide structural support. In some embodiments, the underfill material 144 is formed of polymer, such as epoxy. The underfill material 144 may be dispensed with capillary force, and then may be cured through any suitable curing process.

Afterwards, the structure is sawed, and a package structure 100*a* is formed, in accordance with some embodiments. A semiconductor package structure 100 may include the package structure 100*a* and the package structure 100*b* which are stacked vertically. As shown in FIG. 1H, the package structure 100*a* may include one or more capacitors 146 disposed below and electrically coupled to the redistribution layer 128, in accordance with some embodiments. The capacitors 146 may be disposed between the first conductive terminals 130.

According to the present disclosure, the semiconductor package structure 100 includes semiconductor dies which are stacked by an adhesive layer, instead of bump structures. That is, the semiconductor dies are stacked back-to-back. As a result, flexibility of manufacturing the stacked semiconductor dies and design can be improved, and the cost can be reduced. Single molding and planarizing are adopted in the process according to some embodiments, and thus lower cost and higher yield can be achieved. The approaches are friendly to OSATs production. No underfill process is required.

FIGS. 2A to 2H are cross-sectional views of an exemplary method of forming a semiconductor package structure 200 in accordance with some embodiments of the disclosure. It should be noted that the semiconductor package structure 200 may include the same or similar components as that of the semiconductor package structure 100, which is illustrated in FIG. 1H, and for the sake of simplicity, those components will not be discussed in detail again. In the following embodiments, the semiconductor package structure 200 includes bump structures for electrically coupling a semiconductor die to a redistribution layer.

Figures 2A, 2B:
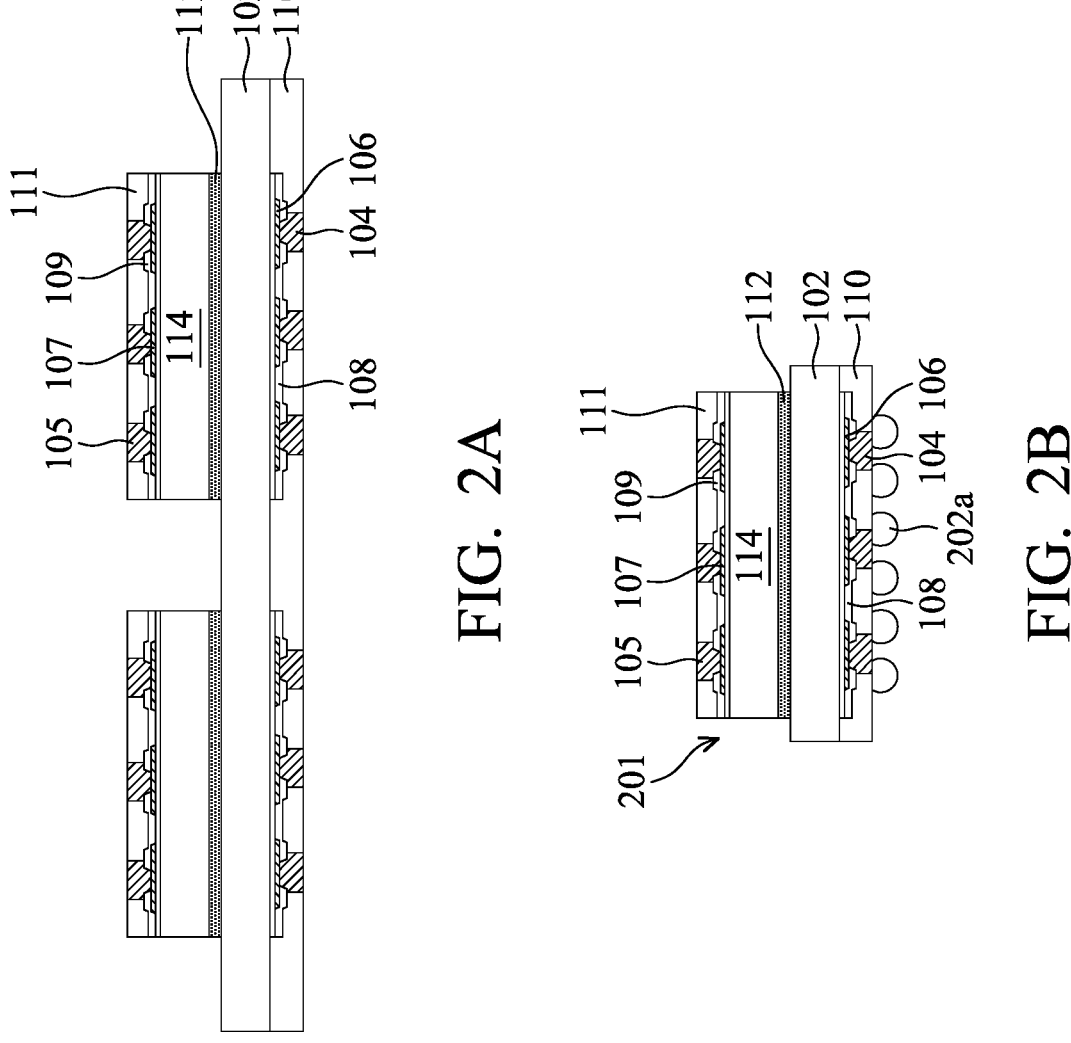
FIGS. 2A to 2H are cross-sectional views of an exemplary method of forming a semiconductor package structure in accordance with some embodiments.

The process steps in FIG. 2A may be similar to the process steps in FIG. 1A, and the same reference numbers in figures are used to depict similar elements. Unless otherwise stated, the materials and formation of these elements are as described above and will not be repeated.

Afterward, as illustrated in FIG. 2B, a plurality of bump structures 202*a* are formed below the first dielectric layer 110 and electrically coupled to the first conductive connectors 104, in accordance with some embodiments. The bump structures 202*a* may include microbumps, controlled collapse chip connection (C4) bumps, solder balls, ball grid array (BGA) balls, the like, or a combination thereof. The bump structures 202*a* may be formed of conductive materials, including metal (e.g., tungsten, titanium, tantalum, ruthenium, cobalt, copper, aluminum, platinum, tin, silver, gold), metallic compound (e.g., tantalum nitride, titanium nitride, tungsten nitride), the like, an alloy thereof, or a combination thereof.

As illustrated in FIG. 2B, the semiconductor wafer 102 is sawed to form the first semiconductor dies 102, in accordance with some embodiments. After sawing, the sidewall of the first dielectric layer 110 may be substantially coplanar with the sidewall of first semiconductor dies 102. A stacking structure 201, including the first semiconductor die 102, the second semiconductor die 114, and the components formed thereon, may be formed.

Figures 2C, 2D:
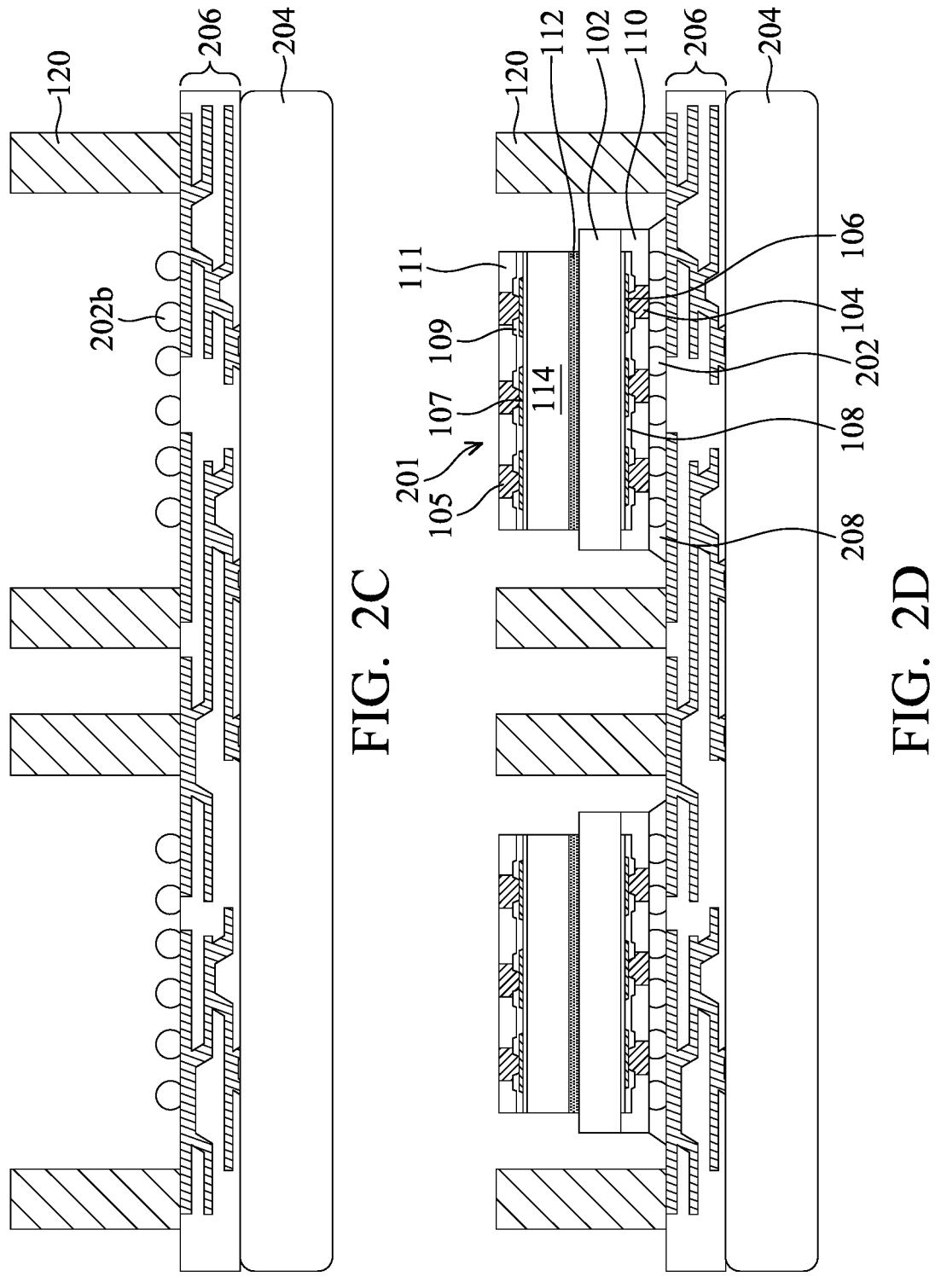

As illustrated in FIG. 2C, a redistribution layer 206 is formed over a carrier substrate 204, in accordance with some embodiments. The carrier substrate 204 may be similar to the carrier substrate 118 as illustrated in FIG. 1C, the redistribution layer 206 may be similar to the redistribution layer 124 as illustrated in FIG. 1D, and will not be repeated.

Afterwards, a plurality of conductive pillars 120 and a plurality of bump structures 202*b* are disposed over and electrically coupled to the redistribution layer 206, in accordance with some embodiments. The bump structures 202*b* may be similar to the bump structures 202*a*, the conductive pillars 120 may be similar to the conductive pillars 120 as illustrated in FIG. 1C, and will not be repeated.

As shown in FIG. 2D, the stacking structure 201 is formed over the redistribution layer 206, in accordance with some embodiments. The bump structures 202*a* and the bump structures 202*b* may form bump structures 202. Then, an underfill material 208 may be formed over the redistribution layer 206. The underfill material 208 may fill in gaps between the bump structures 202. In some embodiments, the underfill material 208 is formed of polymer, such as epoxy or any suitable materials. The underfill material 208 may be dispensed with capillary force, and then may be cured through any suitable curing process.

Since the stacking structure 201 joins on the redistribution layer 206 by the bump structures 202, the redistribution layer 206 can be prepared in advanced. Therefore, the process time can be saved. In addition, the redistribution layer 206 can be selected before joining, thereby increasing the yield.

Additional semiconductor dies may also be disposed over the redistribution layer 206. In addition, one or more passive components (not illustrated), including resistors, capacitors, inductors, the like, or a combination thereof, may be disposed over the redistribution layer 206.

Figure 2E:
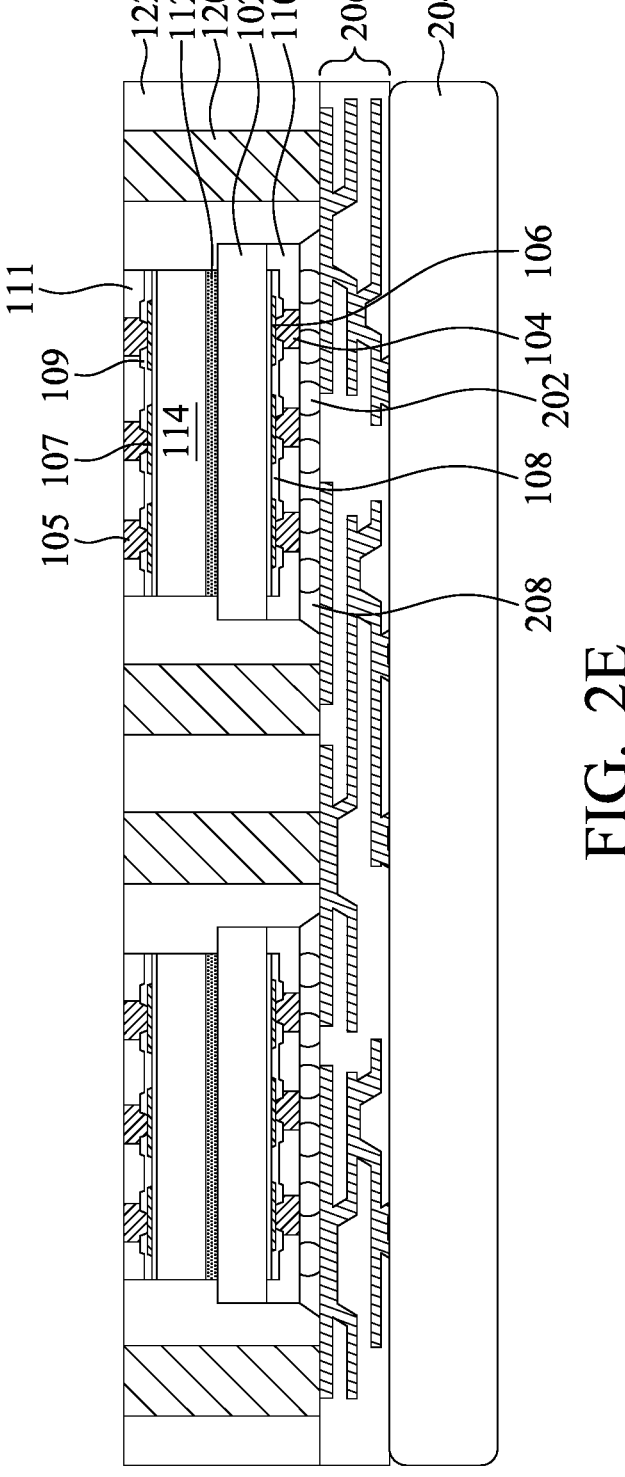

As shown in FIG. 2E, a molding material 122 is formed over the redistribution layer 206, in accordance with some embodiments. The molding material 122 may surround the first semiconductor dies 102, the first dielectric layer 110, the underfill material 208, the adhesive layer 112, the second semiconductor dies 114, the second dielectric layer 111, and the conductive pillars 120. The molding material 122 may protect these components from the environment, thereby preventing them from damage due to stress, chemicals, and moisture. The molding material 122 may be formed of a nonconductive material, including moldable polymer, epoxy, resin, the like, or a combination thereof.

Afterwards, a planarization process is preformed to level the top surface of the molding material 122, the top surfaces of the second conductive connectors 105, and the top surfaces of the conductive pillars 120, in accordance with some embodiments. The planarization process may include a chemical mechanical polishing (CMP) process, a mechanical grinding process, the like, or a combination thereof.

Figure 2F:
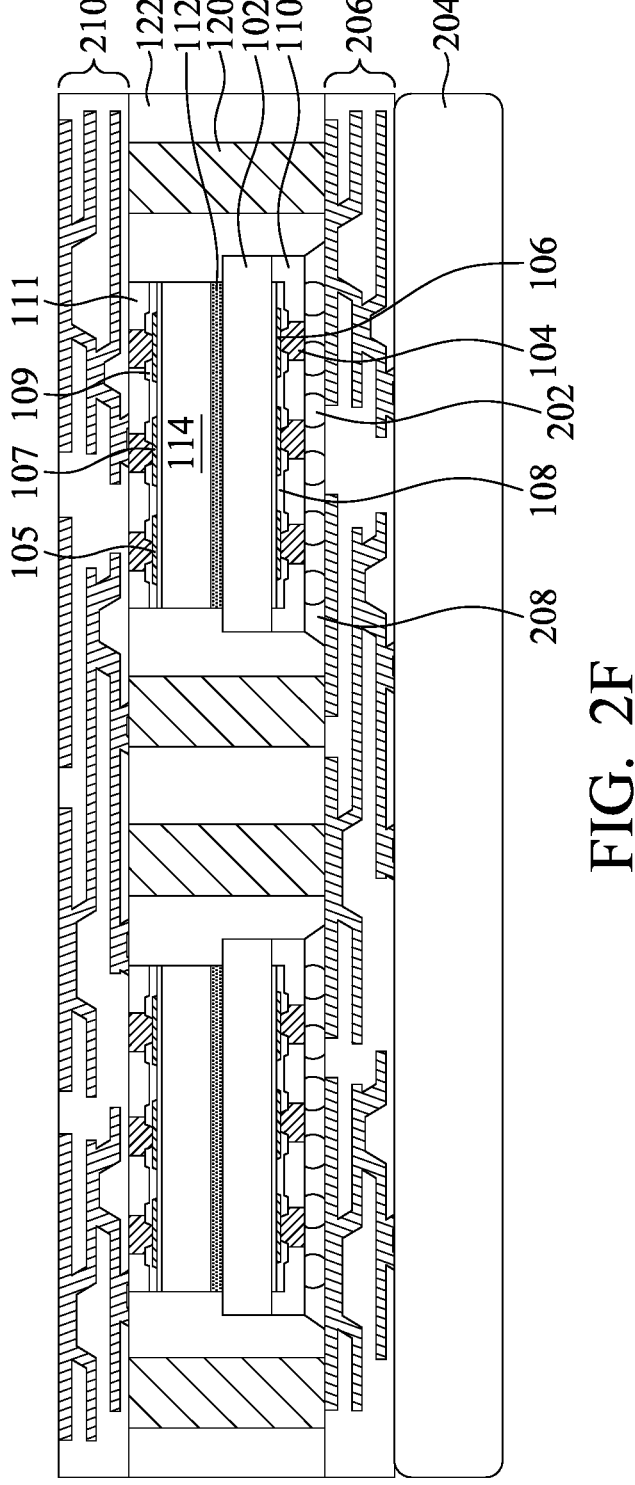

Afterwards, as shown in FIG. 2F, a redistribution layer 210 is formed over the molding material 122, in accordance with some embodiments. The redistribution layer 210 may be electrically coupled to the second semiconductor die 114 through the second conductive connectors 105 and the second conductive pads 107. The redistribution layer 210 may be similar to the redistribution layer 206. However, the numbers of the conductive layers and the passivation layers of the redistribution layer 210 may be different than the numbers of the conductive layers and the passivation layers of the redistribution layer 206.

Figure 2G:
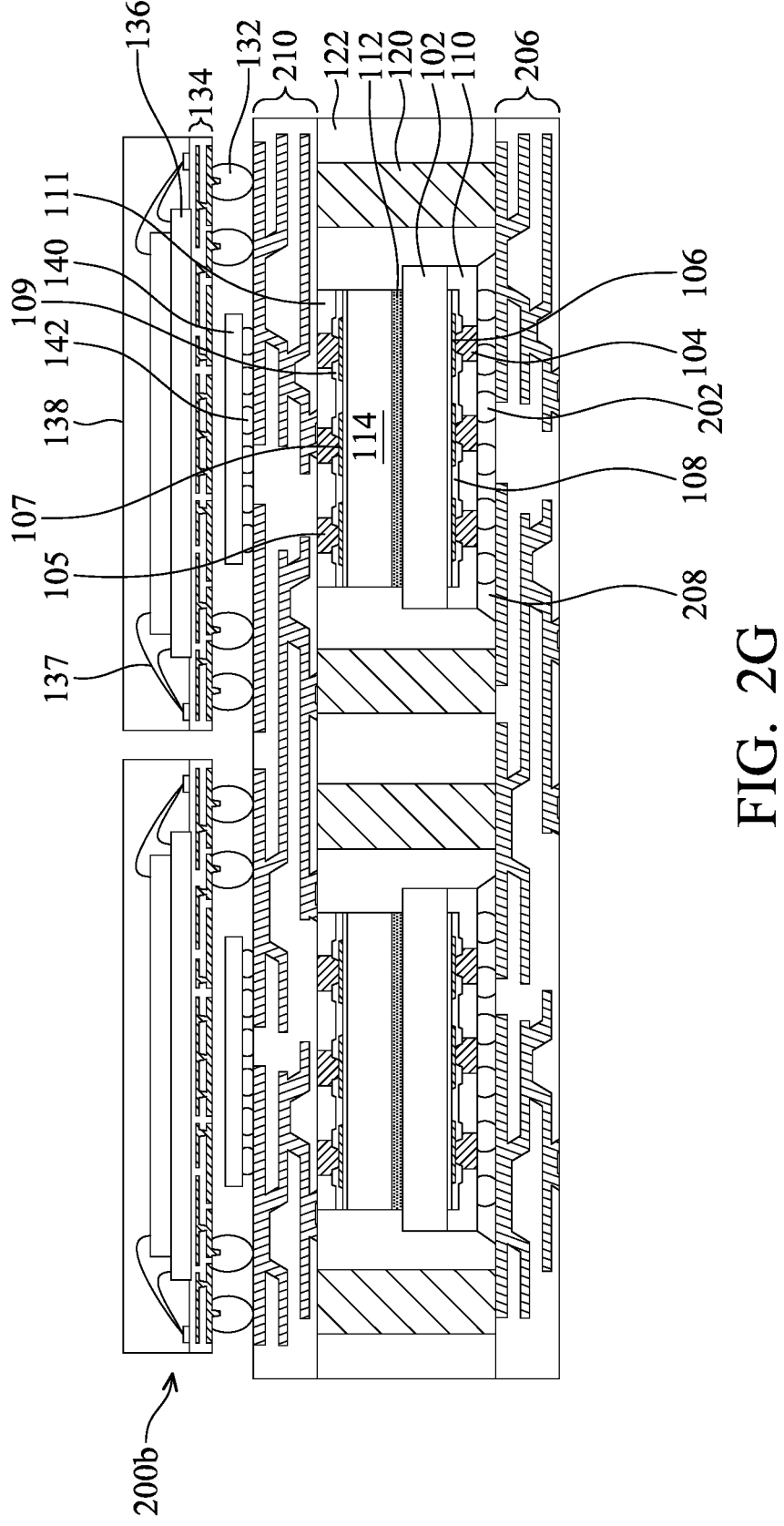

As shown in FIG. 2G, a third semiconductor die 140 and a package structure 200*b* are disposed over the redistribution layer 210, in accordance with some embodiments. The carrier substrate 204 may be removed. The third semiconductor die 140 is optional, and may be omitted in some other embodiments. The third semiconductor die 140 may be electrically coupled to the redistribution layer 210 through a plurality of bump structures 142. The third semiconductor die 140 and the bump structures 142 may be similar to the third semiconductor die 140 and the bump structures 142 as illustrated in FIG. 1G, respectively. The package structure 200*b* may include the components similar to that of the package structure 100*b* as illustrated in FIG. 1G.

Figure 2H:
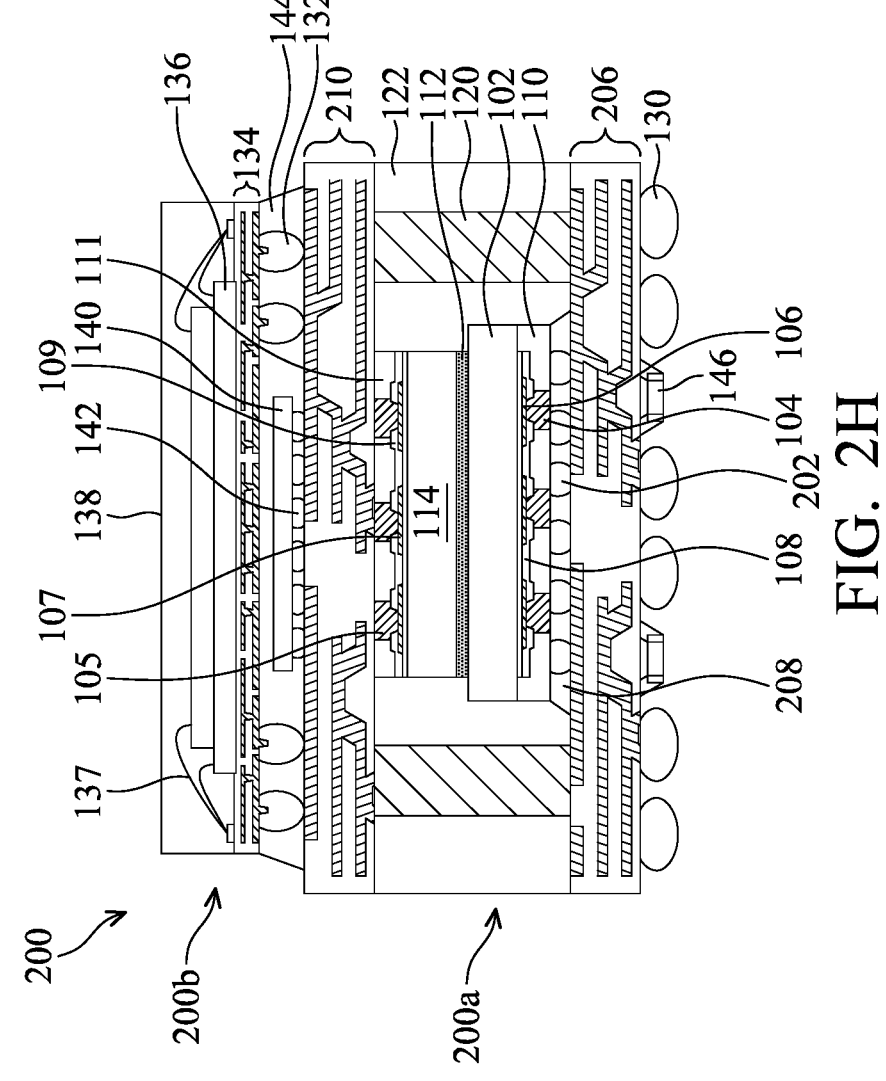

Afterwards, as shown in FIG. 2H, an underfill material 144 is formed over the redistribution layer 210, in accordance with some embodiments. The underfill material 144 may fill in gaps between the second conductive terminals 132, the third semiconductor die 140, and the bump structures 142 to provide structural support. In some embodiments, the underfill material 144 is formed of polymer, such as epoxy. The underfill material 144 may be dispensed with capillary force, and then may be cured through any suitable curing process.

Afterwards, the structure is sawed, and a package structure 200*a* is formed, in accordance with some embodiments. A semiconductor package structure 200 may include the package structure 200*a* and the package structure 200*b* which are stacked vertically. As shown in FIG. 2H, the package structure 200*a* may include one or more capacitors 146 disposed below and electrically coupled to the redistribution layer 206, in accordance with some embodiments. The capacitors 146 may be disposed between the first conductive terminals 130.

According to the present disclosure, the semiconductor package structure 200 includes semiconductor dies which are stacked back-to-back by an adhesive layer. Consequently, flexibility of manufacturing can be improved, and the cost can be reduced. Since single molding and planarizing are used in the process, lower cost and higher yield can be achieved. The approaches are friendly to OSATs production. In addition, by adopting the bump structures 202, the process time can be saved, and the yield can be increased.

Figure 3:
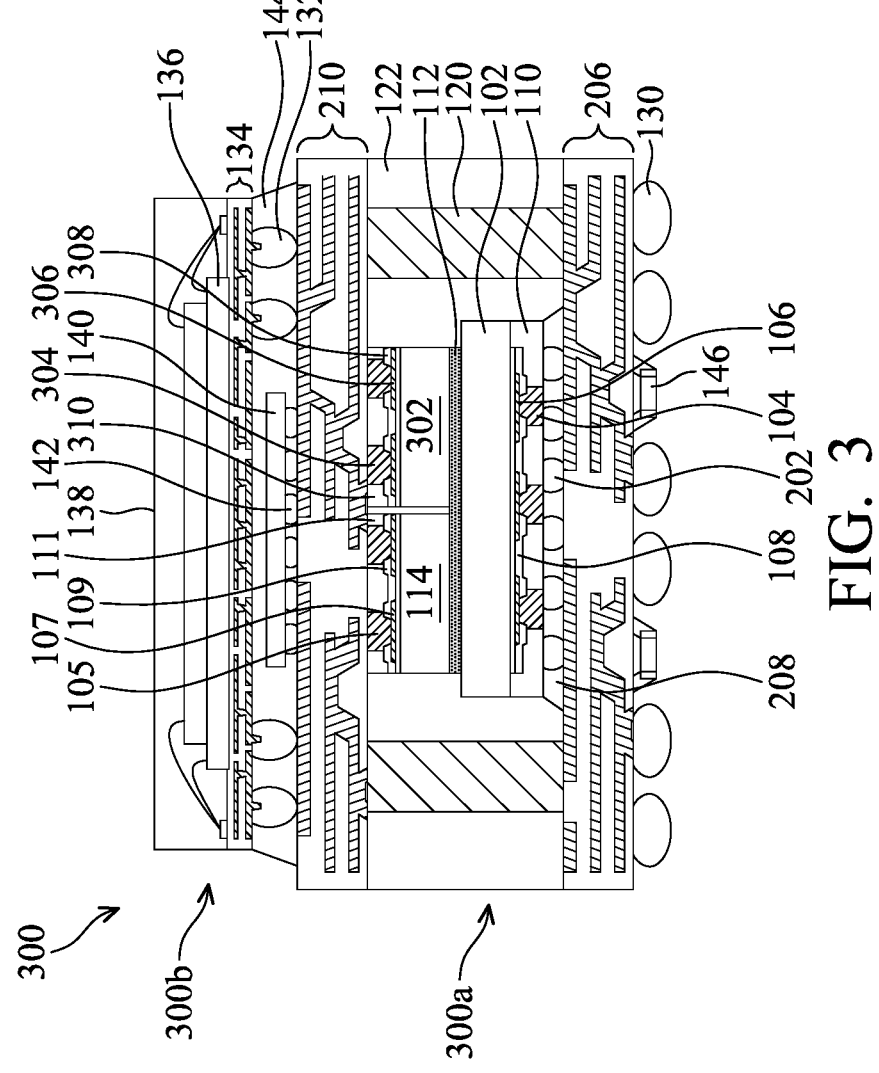
FIG. 3 is a cross-sectional view of an exemplary semiconductor package structure in accordance with some embodiments.

FIG. 3 is a cross-sectional view of a semiconductor package structure 300, in accordance with some embodiments of the disclosure. It should be noted that the semiconductor package structure 300 may include the same or similar components as that of the semiconductor package structure 200, which is illustrated in FIG. 2H, and for the sake of simplicity, those components will not be discussed in detail again. In the following embodiments, the semiconductor package structure 300 includes two semiconductor dies stacked over one semiconductor die.

As shown in FIG. 3, the semiconductor package structure 300 includes a package structure 300*a* and a package structure 300*b* stacked vertically, in accordance with some embodiments. The package structure 300*a* includes a second semiconductor die 114 and a third semiconductor die 302 stacked over a first semiconductor die 102, with an adhesive layer 112 disposed therebetween, in accordance with some embodiments. The second semiconductor die 114 and the third semiconductor die 302 may be arranged side-by-side. In addition, the semiconductor package structure 300 may include a fourth semiconductor die 140.

The first semiconductor die 102, the second semiconductor die 114, and the third semiconductor die 302 may include the exemplary devices as discussed with respect to the first semiconductor die 102 and the second semiconductor die 114 as illustrated in FIG. 1A. The first semiconductor die 102, the second semiconductor die 114, the third semiconductor die 302, and the fourth semiconductor die 140 may include the same or different devices.

Although one adhesive layer 112 is formed as shown in FIG. 3, the present disclosure is not limited thereto. For example, the second semiconductor die 114 may be stacked over the first semiconductor die 102 with one adhesive layer 112 disposed therebetween, and the third semiconductor die 302 may be stacked over the first semiconductor die 102 with another adhesive layer 112 disposed therebetween. In this embodiment, these adhesive layers 112 may be separate, and may be spaced apart by the molding material 122.

As illustrated in FIG. 3, a plurality of second conductive pads 107, a second passivation layer 109, a plurality of second conductive connectors 105, and a second dielectric layer 111 are formed over the second semiconductor dies 114, and a plurality of third conductive pads 306, a third passivation layer 308, a plurality of third conductive connectors 304, and a third dielectric layer 310 are formed over the third semiconductor dies 302, in accordance with some embodiments. The conductive pads 107, 306, the passivation layers 109, 308, the conductive connectors 105, 304, and the dielectric layers 111, 310 may be similar to the second conductive pads 107, the second passivation layer 109, the second conductive connectors 105, and the second dielectric layer 111 as illustrated in FIG. 1A, respectively.

As illustrated in FIG. 3, the molding material 122 may surround the first semiconductor dies 102, the first dielectric layer 110, the underfill material 208, the adhesive layer(s) 112, the second semiconductor dies 114, the second dielectric layer 111, the third semiconductor dies 302, the third dielectric layer 310, and the conductive pillars 120.

The embodiments shown in FIGS. 1A-1H, 2A-2H, and 3 are non-limiting examples, and other variations, combinations, or configurations are possible and considered within the scope of the present disclosure. For example, similar to the description with respect to FIGS. 1A-1H, the semiconductor package structure 300 may not include the bump structures 202 according to some other embodiments. In these embodiments, the first dielectric layer 110 and the first conductive connectors 104 may be in contact with the redistribution layer 206.

In summary, the semiconductor package structure according to the present disclosure includes semiconductor dies which are stacked by an adhesive layer, instead of bump structures. As a result, flexibility of manufacturing the stacked semiconductor dies and design can be improved, and the cost can be reduced. Lower cost and higher yield can also be achieved since single molding and planarizing are used.

In some embodiments, the semiconductor package structure according to the present disclosure further includes bump structures connecting a semiconductor die and a redistribution layer. Therefore, the process time can be saved, and the yield can be increased.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
a first redistribution layer;
a second redistribution layer disposed over the first redistribution layer;
a first semiconductor die and a second semiconductor die stacked vertically between the first redistribution layer and the second redistribution layer, wherein the first semiconductor die is electrically coupled to the first redistribution layer, and the second semiconductor die is electrically coupled to the second redistribution layer;
an adhesive layer extending between the first semiconductor die and the second semiconductor die;
a molding material surrounding the first semiconductor die, the adhesive layer, and the second semiconductor die;
a package structure disposed over and electrically coupled to the second redistribution layer: and
a third semiconductor die disposed between the package structure and the second redistribution layer.

2. The semiconductor package structure as claimed in claim 1, further comprising:
a plurality of first conductive connectors electrically coupling the first semiconductor die to the first redistribution layer; and
a plurality of second conductive connectors electrically coupling the second semiconductor die to the second redistribution layer.

3. The semiconductor package structure as claimed in claim 2, further comprising a plurality of bump structures electrically coupling the plurality of first conductive connectors to the first redistribution layer.

4. The semiconductor package structure as claimed in claim 1, wherein the package structure comprises a plurality of conductive terminals, and the third semiconductor die is disposed between the plurality of conductive terminals.

5. The semiconductor package structure as claimed in claim 1, further comprising a fourth semiconductor die disposed over the adhesive layer and electrically coupled to the second redistribution layer.

6. The semiconductor package structure as claimed in claim 5, wherein the fourth semiconductor die is surrounded by the molding material.

7. The semiconductor package structure as claimed in claim 1, further comprising a plurality of conductive pillars extending through the molding material and electrically coupling the first redistribution layer to the second redistribution layer.

8. A semiconductor package structure, comprising:
a first package structure, comprising:
a first redistribution layer;
a first semiconductor die disposed over the first redistribution layer and electrically coupled to the first redistribution layer through a plurality of first conductive connectors;
a second semiconductor die disposed over the first semiconductor die;
an adhesive layer connecting the first semiconductor die and the second semiconductor die; and
a second redistribution layer disposed over the second semiconductor die and electrically coupled to the second semiconductor die through a plurality of second conductive connectors;
a second package structure disposed over the first package structure; and a third semiconductor die disposed between the second package structure and the first package structure, wherein the second semiconductor die is disposed between the first semiconductor die and the third semiconductor die.

9. The semiconductor package structure as claimed in claim 8, wherein the plurality of first conductive connectors is disposed in a first dielectric layer, and the plurality of second conductive connectors is disposed in a second dielectric layer.

10. The semiconductor package structure as claimed in claim 9, further comprising a molding material surrounding the first dielectric layer, the first semiconductor die, the adhesive layer, the second semiconductor die, and the second dielectric layer.

11. The semiconductor package structure as claimed in claim 8, further comprising a plurality of bump structures electrically coupling the plurality of first conductive connectors to the first redistribution layer and surrounded by an underfill material.

12. The semiconductor package structure as claimed in claim 1, further comprising an underfill material disposed over the second redistribution layer and surrounding the third semiconductor die.

13. The semiconductor package structure as claimed in claim 8, wherein the third semiconductor die is connected to the first semiconductor die through the adhesive layer.

14. The semiconductor package structure as claimed in claim 13, wherein the third semiconductor die is electrically coupled to the second redistribution layer through a plurality of third conductive connectors.

15. A semiconductor package structure, comprising:
a first redistribution layer;
a second redistribution layer disposed over the first redistribution layer;
a first semiconductor die disposed between the first redistribution layer and the second redistribution layer and electrically coupled to the first redistribution layer;

a second semiconductor die and a third semiconductor die disposed side-by-side over the first semiconductor die and electrically coupled to the second redistribution layer;
an adhesive layer connecting the first semiconductor die and the second semiconductor die and connecting the first semiconductor die and the third semiconductor die;
a molding material surrounding the first semiconductor die, the adhesive layer, the second semiconductor die, and the third semiconductor die;
a package structure disposed over and electrically coupled to the second redistribution layer; and
a fourth semiconductor die disposed between the package structure and the second redistribution layer.

16. The semiconductor package structure as claimed in claim 15, further comprising a plurality of first conductive terminals disposed below the first redistribution layer and electrically coupled to the first redistribution layer.

17. The semiconductor package structure as claimed in claim 15, further comprising:
an underfill material surrounding the fourth semiconductor die.

18. The semiconductor package structure as claimed in claim 15, further comprising:
a plurality of first conductive connectors electrically coupling the first semiconductor die to the first redistribution layer;
a plurality of second conductive connectors electrically coupling the second semiconductor die to the second redistribution layer; and
a plurality of third conductive connectors electrically coupling the third semiconductor die to the second redistribution layer.

19. The semiconductor package structure as claimed in claim 18, further comprising a plurality of bump structures electrically coupling the plurality of first semiconductor dies to the first redistribution layer.

* * * * *